United States Patent [19]

Chen et al.

[11] Patent Number: 5,449,947
[45] Date of Patent: Sep. 12, 1995

[54] READ-DISTURB TOLERANT METAL-TO-METAL ANTIFUSE AND FABRICATION METHOD

[75] Inventors: Wenn-Jei Chen, Sunnyvale; Steve S. Chiang, Saratoga; Esam Elashmawi, San Jose, all of Calif.

[73] Assignee: Actel Corporation, Sunnyvale, Calif.

[21] Appl. No.: 88,298

[22] Filed: Jul. 7, 1993

[51] Int. Cl.⁶ .......................................... H01L 27/02
[52] U.S. Cl. ...................................... 257/530; 257/50
[58] Field of Search .................................. 257/530, 50

[56] References Cited

U.S. PATENT DOCUMENTS

| | | | |
|---|---|---|---|
| 4,651,409 | 3/1987 | Ellsworth et al. | 29/576 B |
| 4,748,490 | 5/1988 | Hollingsworth | 357/51 |
| 4,796,075 | 1/1989 | Whitten | 357/51 |
| 4,822,753 | 4/1989 | Pintchovski | 437/192 |
| 4,823,181 | 4/1989 | Mohsen et al. | 357/51 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 257/530 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,181,096 | 1/1993 | Forouhi | 257/330 |
| 5,194,759 | 3/1993 | El-Ayat et al. | 307/202.1 |
| 5,196,724 | 3/1993 | Gordon et al. | 257/530 |
| 5,233,217 | 8/1993 | Dixit et al. | 257/530 |
| 5,266,829 | 11/1993 | Hamdy et al. | 257/530 |
| 5,270,251 | 12/1993 | Cohen | 257/530 |
| 5,272,101 | 12/1993 | Forouhi et al. | 437/44 |
| 5,272,666 | 12/1993 | Tsang et al. | 365/96 |
| 5,290,734 | 3/1994 | Boardman et al. | 437/195 |
| 5,300,456 | 4/1994 | Tigelaar et al. | 437/195 |
| 5,308,795 | 5/1994 | Hawley et al. | 437/195 |
| 5,322,812 | 6/1994 | Dixit et al. | 437/60 |

*Primary Examiner*—J. Carroll
*Attorney, Agent, or Firm*—D'Alessandro & Ritchie

[57] ABSTRACT

A "read-disturb" resistant metal-to-metal antifuse includes a lower electrode comprising a first metal layer in a microcircuit structure. An inter-metal dielectric is disposed over the lower electrode and includes an antifuse aperture disposed therein. A first layer of antifuse material is disposed over exposed surface of the lower electrode in the antifuse aperture. A highly conductive layer is disposed over the first region of antifuse material and a second layer of antifuse material is disposed over the highly conductive layer. An upper electrode comprises a second metal layer disposed over the second layer of antifuse material. The first and second layers of antifuse material may comprise single-layer or multi-layer dielectric materials, amorphous silicon, or combinations of these materials. A process for fabricating a read-disturb resistant metal-to-metal antifuse comprises the steps of forming a lower electrode comprising a portion of a first metal layer in a microcircuit structure; forming an inter-metal dielectric layer over the lower electrode; forming an antifuse aperture in the inter-metal dielectric layer to expose the upper surface of the lower electrode; forming a first layer of antifuse material over the exposed surface of the lower electrode in the antifuse aperture; forming a highly conductive layer over the first layer of antifuse material; forming a second layer of antifuse material over the highly conductive layer; and forming an upper electrode comprising a second metal layer over the second layer of antifuse material.

5 Claims, 5 Drawing Sheets

READ-DISTURB TOLERANT METAL-TO-METAL ANTIFUSE AND FABRICATION METHOD

BACKGROUND OF THE INVENTION

1. Field of the Invention

The present invention relates to antifuse technology. More particularly, the present invention relates to electrically programmable metal-to-metal antifuse structures which are tolerant to read-disturb phenomena and to processes for fabricating these antifuse structures.

2. The Prior Art

Integrated circuits which can be configured or programmed by the user for a specific application are becoming increasingly popular. Programmability of such circuits is accomplished by employing programmable interconnect elements in the packaged integrated circuit which the user programs to make or break connections to selected electrical nodes within the circuit such that the programmed device may perform a desired function.

Antifuses are used extensively in user-programmable circuits and are well known. Antifuses generally consist of two conductive electrodes separated by one or more layers of insulating material. The lower conductor is covered with an insulating material into which an antifuse aperture is disposed in the region where it is desired to form the antifuse. The antifuse material is disposed in the aperture region and is covered by one or more of conductive layers which will serve as the upper electrode. Unprogrammed, these links isolate the electronic nodes in the programmable device. The resistance of an unprogrammed antifuse is typically in the range of 1 Gohm.

When programmed an antifuse creates a relatively low resistance link between two circuit nodes in the typical user programmable device. During programming, the antifuse material between the electrodes is broken down by a current developed from a predetermined programming voltage (typically 16-20 volts) applied to the electrodes of the selected antifuse. A conductive filament is thereby formed which electrically connects the upper and lower electrodes of the selected links. The resistance of a programmed antifuse is less than 1 Mohm and typically in the range of hundreds or thousands of ohms.

In most applications, it is desirable to make the resistance of a programmed antifuse as low as possible in order to maximize circuit performance, and to minimize drive, impedance-matching and noise problems within the circuit containing the antifuse. In addition, antifuse reliability is crucial to providing a commercially-viable product. In any circuit containing a plurality of antifuses, the antifuse links must be manufactured so as to reliably program at the selected programming voltage and to remain in their user-selected state during the operating life of the circuit of which they are a part. This requires minimizing the leakage currents that flow in unprogrammed antifuses and assuring that programmed antifuse do not change resistance over time. The conductive filament of a programmed antifuse must offer high electromigration immunity, thereby maintaining the low resistance conductive path for the operating life of the device.

There are several different varieties of antifuses. One type of antifuse includes a lower electrode comprising a doped region in a semiconductor substrate and an upper electrode comprising a heavily doped polysilicon layer. A multilayer sandwich structure with oxide-nitride-oxide (ONO) comprises the antifuse material. Examples of these structures are found in U.S. Pat. Nos. 4,823,181 to Mohsen et al. and 4,899,205 to Hamdy et al.

Recently, another type of antifuse formed between metal electrodes which may comprise portions of metal interconnect layers disposed in the integrated circuit has been employed. The metal-to-metal antifuse offers the advantage of low programmed antifuse resistance as well as the ability to fabricate denser antifuse array architectures due to the fact that no substrate area is needed for the antifuse structure.

Despite the advantages of metal-to-metal antifuses, it has been observed that they are susceptible to a phenomenon known as "read-disturb," which is defined as an increase in the ON resistance of the programmed antifuse during its lifetime. ON resistance of the antifuse may even increase to the point where the antifuse will revert to its open-circuit state. Read-disturb is obviously a substantial reliability issue.

After the antifuse is programmed it has to endure operation conditions where it could be subjected to both DC and/or AC voltage pulses at both high and low temperatures. During operation, when a DC voltage with a polarity opposite to the polarity of the programming pulse is applied to the already programmed antifuses, the ON state of the antifuse can be disturbed and the ON resistance can increase, sometimes to the point where the antifuse reverts to its OFF (unprogrammed) state again.

It is believed that the read-disturb phenomenon is largely an artifact of electromigration of the conductive filament material. It has been observed that during positive DC stress, the on resistance can be disturbed, however, the probability is much less than the reverse DC stress. The read-disturb phenomenon is also observed under AC operating conditions. In addition, when the operation temperature is raised, the probability of read-disturb will increase.

In an attempt to minimize the effect of read-disturb on metal-to-metal antifuses, one current prior art approach has been to limit their operating current to a value far below the programming current. The idea is that with high programming current, the conductive link created is much larger. With low operating current, the disturb is small since only a small part of the link will be affected by the low current. However, the penalty of such an approach is that in order to provide high programming current, the transistor in the integrated circuit used to provide the programming current to the antifuse has to be made larger. This increases the die size and limits the ability to scale the integrated circuit device containing the antifuses.

A second approach employed by the prior art in an attempt to overcome the read-disturb problem is to reduce the thickness of the layer of antifuse material. By reducing the antifuse thickness, a larger conductive filament can be created with the same programming voltages. The larger filaments will be less susceptible to read-disturb problems. However, when this approach is used, the antifuse may exhibit poor leakage, higher capacitance and increased failure characteristics.

In order to overcome the disadvantages of the prior art antifuses while maintaining low capacitance, and better breakdown voltage and leakage characteristics, it is the object of the present invention to provide an electrically programmable antifuse composite structure which improves the "read-disturb" resistance without having to increase the programming current. This involves depositing a highly conductive material, such as metals or doped amorphous silicon, sandwiched inside the antifuse composite.

It is therefore an object of the invention to provide a metal-to-metal antifuse structure which has an improved immunity to read-disturb problems.

It is a further object of the invention to provide a process for fabricating a read-disturb resistant antifuse.

BRIEF DESCRIPTION OF THE INVENTION

According to a first aspect of the invention, a "read-disturb" resistant metal-to-metal antifuse includes a lower electrode comprising a portion of a first metal layer in a microcircuit structure. An inter-metal dielectric is disposed over the lower electrode and includes an antifuse aperture disposed therein. A first layer of antifuse material is disposed over the exposed surface of the lower electrode in the antifuse aperture. A highly electrically conductive layer is disposed over the first region of antifuse material and a second layer of antifuse material is disposed over the highly electrically conductive layer. An upper electrode comprising a second metal layer is disposed over the second layer of antifuse material. The first and second layers of antifuse material may comprise single-layer or multi-layer dielectric materials, amorphous silicon, or combinations of these materials.

In a variation of this structure according to the present invention, a stacked structure comprises a portion of a first metal layer in a microcircuit structure. A first layer of antifuse material is disposed over the exposed surface of the lower electrode. A highly electrically conductive layer is disposed over the first region of antifuse material and a second layer of antifuse material is disposed over the highly electrically conductive layer. A stacked structure is then defined including the first antifuse layer, the highly electrically conductive layer, and the second antifuse layer. An inter-metal dielectric is disposed over the stack and includes an antifuse aperture exposing the stack is disposed therein. An upper electrode comprising a second metal layer is disposed over the second antifuse material layer in the antifuse aperture. The first and second layers of antifuse material may comprise single-layer or multi-layer dielectric materials, amorphous silicon, or combinations of these materials.

In another variation of this structure according to the present invention, a plug process includes a lower electrode comprising a portion of a first metal layer in a microcircuit structure. An inter-metal dielectric is disposed over the lower electrode and includes an antifuse aperture disposed therein. A metal plug material is disposed in the antifuse aperture and a first layer of antifuse material is disposed over the metal plug material in the antifuse aperture. A highly electrically conductive layer is disposed over the first region of antifuse material and a second layer of antifuse material is disposed over the highly electrically conductive layer. An upper electrode comprising a second metal layer is disposed over the second layer of antifuse material. The first and second layers of antifuse material may comprise single-layer or multi-layer dielectric materials, amorphous silicon, or combinations of these materials.

According to a second aspect of the invention, a process for fabricating a read-disturb resistant metal-to-metal antifuse comprises the steps of forming a lower electrode comprising a portion of a first metal layer in a microcircuit structure; forming an inter-metal dielectric layer over the lower electrode; forming an antifuse aperture in the inter-metal dielectric layer to expose the upper surface of the lower electrode; forming a first layer of antifuse material over the exposed surface of the lower electrode in the antifuse aperture; forming a highly electrically conductive layer over the first layer of antifuse material; forming a second layer of antifuse material over the highly electrically conductive layer; and forming an upper electrode comprising a second metal layer over the second layer of antifuse material.

In a variation of the fabrication process according to the present invention, a stacked structure comprising the first antifuse material layer, the highly electrically conductive layer, and the second antifuse material layer is formed and defined over the lower antifuse electrode; an inter-metal dielectric layer is formed over the stacked structure; an antifuse aperture is formed in the inter-metal dielectric layer; and a top electrode is formed over the second antifuse material layer in the antifuse aperture.

Another variation of the fabrication process according to the present invention comprises the steps of forming a lower electrode comprising a portion of a first metal layer in a microcircuit structure; forming an inter-metal dielectric layer over the lower electrode; forming an antifuse aperture in the inter-metal dielectric layer to expose the upper surface of the lower electrode; forming a metal plug over the exposed surface of the lower electrode in the antifuse aperture; forming a first layer of antifuse material over the metal plug layer; forming a highly electrically conductive layer over the first layer of antifuse material; forming a second layer of antifuse material over the highly electrically conductive layer; and forming an upper electrode comprising a second metal layer over the second layer of antifuse material.

DETAILED DESCRIPTION OF A PREFERRED EMBODIMENT

Those of ordinary skill in the art will realize that the following description of the present invention is illustrative only and in no way limiting. Other embodiments of the present invention will readily suggest themselves to such skilled persons.

The materials used to form the layers of the antifuses of the present invention, and the processes used to fabricate them, may be chosen from among the many variations of existing technology. Examples of that technology, which are by way of illustration only, and are not intended to be in any way limiting, include the technology disclosed in U.S. Pat. Nos. 4,823,181, to Mohsen et al., issued Apr. 18, 1989, and 4,899,205, to Hamdy et al., issued Feb. 6, 1990. Both of these patents are expressly incorporated hereby by reference.

Figure 1:
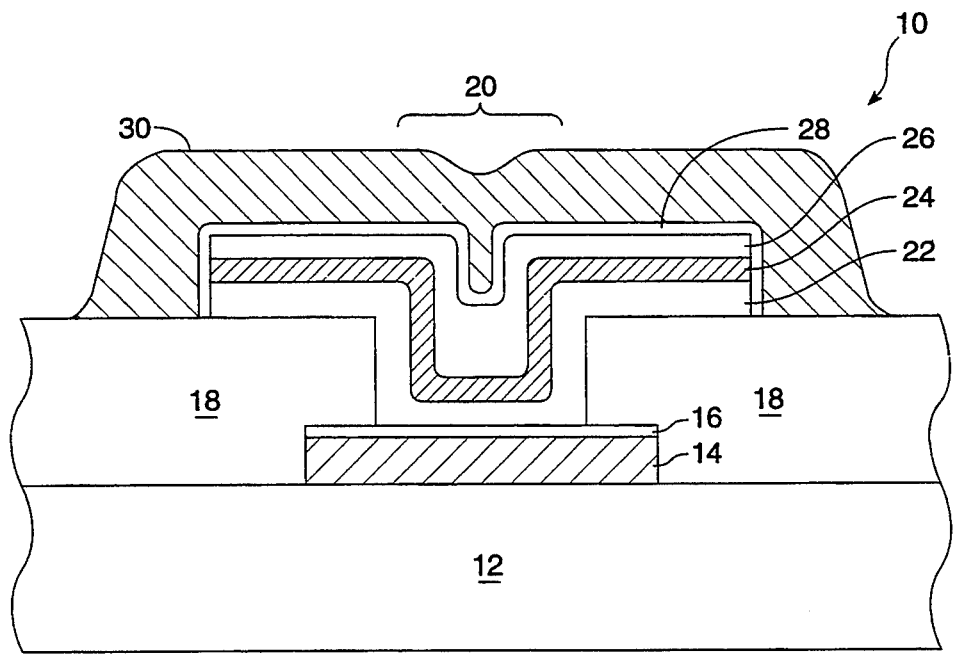
FIG. 1 is a cross sectional view of a antifuse structure according to a first embodiment of the invention.

Referring first to FIG. 1, a metal-to-metal antifuse 10 according to a first embodiment of the present invention is depicted in cross-sectional view. Antifuse 10 is fabricated upon a suitable substrate 12. Substrate 12 may comprise any one of a number of materials. For example, in an integrated circuit embodiment of the present invention, substrate 12 may comprise all of the underlying layers of the integrated circuit structure existing prior to the metallization steps which are used to form the first (or any subsequent) metal interconnect layer. In this instance, the layer immediately underlying the antifuse structure of the present invention will comprise some kind of insulating layer, such as silicon dioxide. In other embodiments, substrate 12 may itself comprise an insulating material compatible with the materials from which antifuse 10 is to be formed. In still other embodiments, the substrate 12 may comprise a conductive layer, such as a metal or other conductive material.

A lower electrode 14, which may comprise a portion of a metal interconnect layer, is disposed on the upper surface of substrate 12. If the substrate is formed from a non-conducting material, lower electrode 14 may be formed directly on its surface, or over an intervening adhesion promoting layer as will be appreciated by those of ordinary skill in the art. Lower electrode 14 may compromise a number of different metals. Non-exhaustive examples of suitable materials include Al, AlCu, Cu, TiW, TiN or a combination of the above, etc. Those of ordinary skill in the art will readily be able to select an appropriate material using conventional design criteria. Materials-processing methods for forming the lower electrodes disclosed or suggested herein are well understood by those ordinarily skilled in the art, and the thickness for the lower electrode 14 may also be readily selected by such skilled persons.

Throughout this specification, the terms "first metal interconnect layer" and "second metal interconnect layer" will be employed. These terms are meant to be relative only, in that the first metal interconnect layer is formed prior to formation of the second metal interconnect layer. The meanings of these terms are, therefore, not to be limited to the first and second interconnect metal layers as these terms are commonly employed in the integrated circuit art, but may apply to any two metal layers, one of which is formed prior to the other, regardless of their absolute numerical order in the structure or whether there are any other intervening metal layers disposed between them in other parts of the structure or formed intermediately therein.

Where necessary, depending upon the materials used in the lower and upper electrodes and in the antifuse material layers, it is common to employ barrier metals such as, Ti, TiW, and TiN or a combination thereof as a layer or layers above the lower electrode and below the upper electrode to minimize read disturb and electromigration effects in the programmed antifuse. For example, where lower electrode 14 comprises aluminum or an aluminum alloy, a lower barrier layer (or layers) will be appropriate to prevent diffusion of aluminum atoms into the antifuse material. Accordingly, lower barrier layer 16 is shown in FIG. 1 formed over lower electrode 14. Those of ordinary skill in the art will recognize when lower barrier layer 16 is not necessary, and will know that it may be omitted where appropriate. Where used, the thickness of lower barrier layer 16 should be sufficient for it to perform adequately as a diffusion barrier. A typical thickness for this layer are in the range of about 10 nm to 500 nm.

An inter-metal dielectric layer 18 is formed over lower electrode 14 and lower barrier layer 16. Inter-metal dielectric layer 18 may comprise a variety of materials known for such use, the most common one being LPCVD silicon dioxide, grown to a thickness in the range of from about 100 nm to 1 um, using conventional semiconductor processing techniques. An antifuse aperture 20 is formed in inter-metal dielectric layer 18 to expose the upper surface of lower barrier layer 16 (or lower electrode 14 if lower barrier layer 16 is not present) in the region where it is desired to form the antifuse, using conventional photolithography and etching techniques.

According to the present invention, an antifuse material comprises a multilayer sandwich. According to a presently preferred embodiment of the invention, the antifuse material comprises two layers of amorphous silicon or other known antifuse material, such as $SiO_2$ or $Si_3N_4$, with a layer of highly conductive material sandwiched in between them. Thus, as may be seen from FIG. 1, a first antifuse material layer 22 is disposed in antifuse aperture 20 in contact with the upper surface of barrier layer 16 (or lower electrode 14). According to a presently preferred embodiment of the invention, first antifuse material layer 22 may comprise a layer of amorphous silicon having a thickness of between about 10 nm to 150 nm or a layer of $SiO_2$ or $Si_3N_4$ having a thickness in the range of about 5 nm to 20 nm. One ordinarily skilled in the art will appreciate that antifuse material layer 22 may be either a single or multiple layer in order to achieve the optimum results.

A highly electrically conductive material layer 24 is disposed over the first antifuse material layer 22. The highly conductive material layer 24 is preferably formed with a material having a high electromigration resistance and may preferably comprise a layer of Ti, TiN, TiW or a combination thereof or Cu or AlCu or other similar materials in combination with Ti, TiN, TiW or a combination thereof having a total thickness of between about 10 nm and 500 nm. Other highly conductive materials, such as doped polysilicon or doped amorphous silicon, may also be employed having a thickness ranging from about 10 nm and 500 nm. One ordinarily skilled in the art will appreciate that highly conductive material layer 24 may be either a single or multiple layer in order to achieve the optimum results.

A second antifuse material layer 26 is disposed over highly conductive material layer 24. According to a presently preferred embodiment of the invention, second antifuse material layer 26 may comprise a layer of amorphous silicon having a thickness of between about 10 nm to 150 nm or a layer of $SiO_2$ or $Si_3N_4$ having a thickness in the range of about 5 nm to 20 nm. Those ordinarily skilled in the art will recognize that the first antifuse dielectric layer 26 may be either a single or multiple layer in order to achieve the optimum results.

Those of ordinary skill in the art will recognize that the programming voltage at which antifuse 10 will program will depend on the thicknesses of the multilayer antifuse material layers. Given the thickness ranges for the materials stated above, the resulting antifuse may be expected to program at voltages between about 8 volts to 30 volts.

One advantage of the present invention is that the overall thickness of the composite antifuse material structure may be chosen to be approximately the same as for a prior art antifuse having a similar geometry, whereby the net capacitance of the antifuse will remain the same or be slightly less while the thickness of the antifuse will be the same or slightly more. Therefore no significant change in programming conditions will be required.

An upper barrier layer 28 is formed over the top surface of second antifuse material layer 26. Like the lower barrier layer 16, the inclusion of upper barrier layer 28, which also like the lower barrier layer 16 may be either a single or multilayer structure, depends upon the compositions of second antifuse material layer 26 below it and the upper electrode 30 which will be formed over it. The main consideration in deciding whether to employ such an upper barrier layer 28 is the avoidance of potential interdiffusion of the materials from which these two elements are formed. Those of ordinary skill in the art will be readily able to determine whether this layer is necessary, and if so, from what to form it and to what thickness it may be formed. Materials, such as Ti, TiW, and TiN or a combination thereof having a thickness of 10 nm to 500 nm are commonly employed for upper barrier layer 28.

Finally, upper electrode 30 is disposed over upper barrier layer 28 (or second antifuse material layer 26 if upper barrier layer 28 is unnecessary). Upper electrode 30 will usually comprise a portion of a metal interconnect layer in the circuit structure and its composition and thickness will be determined by design considerations for that layer. Those of ordinary skill in the art will recognize that lower electrode 14 and upper electrode 30 need not be fabricated from the same material.

According to a presently preferred embodiment of the invention, a two-step programming process may be employed because of the sandwiched antifuse material structure. In the first step of the link forming process, one side of the antifuse composite above or below the sandwiched floating conductive layer will be programmed. The other side will then be programmed. Since the full programming voltage can be applied to a thinner antifuse link in this second programming step, a larger link will be created. This two step link forming process will produce a more conductive and stable link than the conventional antifuse having a similar programming (breakdown) voltage.

The antifuse according to the present invention possesses superior characteristics. Both the electromigration and stress migration resistance of the antifuse structure of the present invention is a significant improvement over the prior art. The layer of highly conductive material sandwiched between the antifuse material layers provides extra heat sinking capacity and improved thermal conductivity, and results in a larger, and more conductive and stable link. These parameters are critical to better electromigration and stress migration resistance of the antifuse of the present invention. Further, the prudent selection of the floating conductive layer material will increase electromigration stress migration resistance and increase the resistance of the device to read-disturb phenomena.

Figure 2:
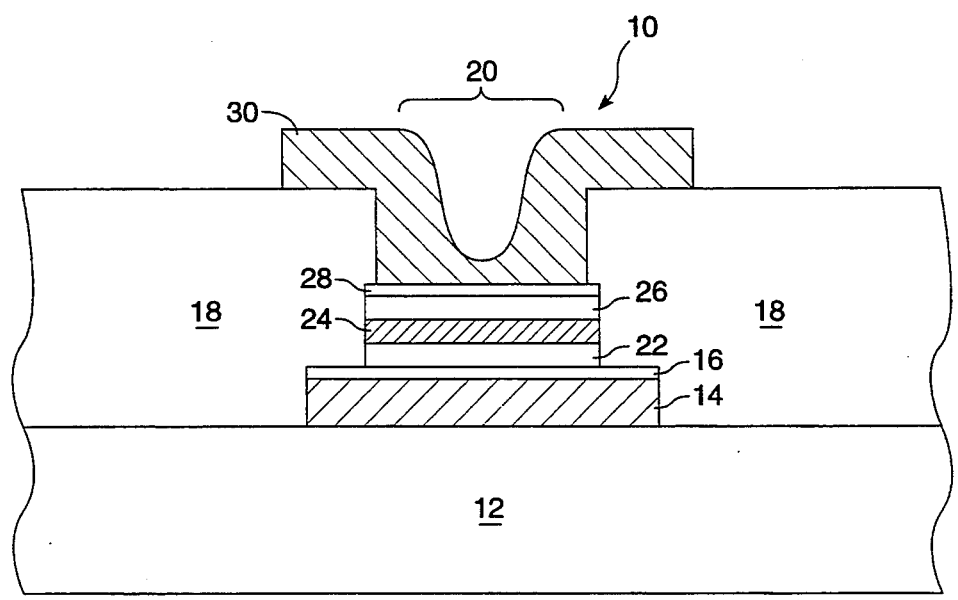
FIG. 2 is a cross sectional view of a antifuse structure according to a second embodiment of the invention.

According to a second embodiment of the present invention, an antifuse is provided having a "stacked" geometry. Referring now to FIG. 2, a stacked-geometry metal-to-metal antifuse 10 according to a second embodiment of the present invention is depicted in cross-sectional view. The same reference numerals as used in FIG. 1 will be employed to describe like structures in the antifuse of FIG. 2.

Antifuse 10 is fabricated upon a suitable substrate 12. As in the embodiment of FIG. 1, substrate 12 of the antifuse of FIG. 2 may comprise any one of a number of materials. A lower electrode 14, which may comprise a portion of a metal interconnect layer, is disposed on the surface of substrate 12. Lower electrode 12 may be selected from the same material as lower electrode 12 of the embodiment of FIG. 1.

As in the embodiment of FIG. 1, a lower barrier layer 16 may be appropriate, depending on the nature of the antifuse material and the material from which lower electrode 14 is formed. Those of ordinary skill in the art will recognize that the same considerations as those of the embodiment of FIG. 1 apply when deciding whether to employ a barrier material and selecting a barrier material.

At this point in the structure, the differences between the embodiment of FIG. 1 and the embodiment of FIG. 2 become apparent. In the embodiment of FIG. 1, inter-metal dielectric layer 18 is formed, an antifuse aperture 20 is formed therein, and the composite antifuse material structure is formed in the antifuse aperture 20. In the embodiment of FIG. 2, the composite antifuse material structure is formed as a stack and then defined, and the inter-metal dielectric layer 18 is then formed over the already defined stack.

Thus, from FIG. 2, it may be seen that the stack comprises first antifuse material layer 22, highly conductive layer 24, second antifuse material layer 26, and upper barrier layer 28 (if necessary). The stack may be defined by a single masking and etching step as is known in the art. Inter-metal dielectric layer 18 is then disposed over the stack and antifuse aperture 20 is formed to expose the upper surface of upper barrier layer 28, which may function conveniently as an etch stop.

Finally, upper electrode 30 is formed in antifuse aperture 20. The considerations for forming the upper electrode 30 of the embodiment of FIG. 2 are the same as for the embodiment depicted in FIG. 1.

Those of ordinary skill in the art will recognize that the programming voltage at which antifuse 10 will program will be the approximately the same as for the antifuse shown in FIG. 1, given similar layer thicknesses. The same two-step programming process may be advantageously employed to program the antifuse of FIG. 2.

As in the embodiment described in FIG. 1, this embodiment of the antifuse according to the present invention also possesses the superior characteristics indicated in the discussion of FIG. 1. The highly conductive layer results in a link which is larger, more conductive and more stable, and the electromigration and stress migration resistance of the antifuse structure of the present invention are significantly improved.

Figure 3:
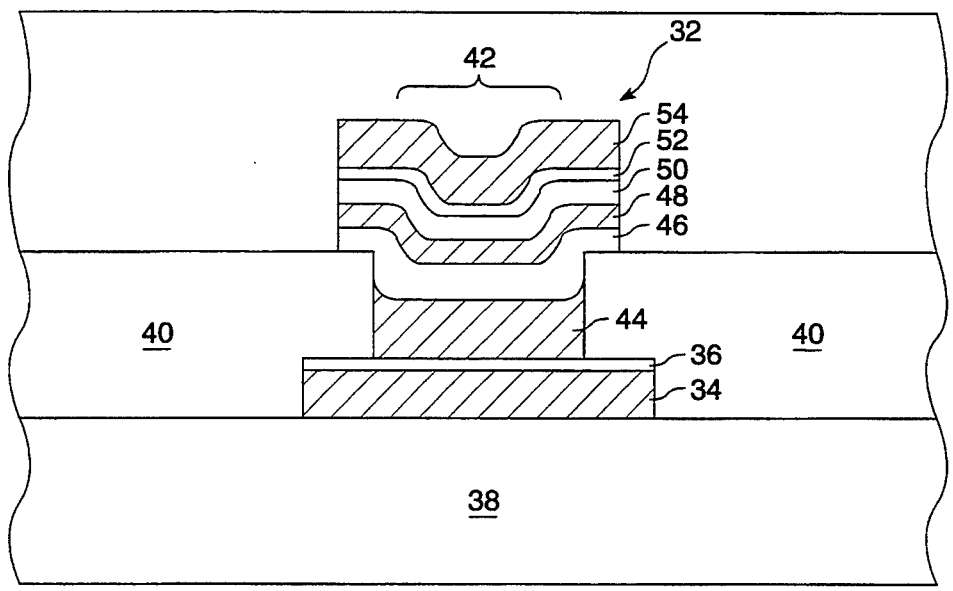
FIG. 3 is a cross sectional view of a antifuse structure according to a third embodiment of the invention.

According to another aspect of the invention in a variation of the structure shown in FIG. 1, a tungsten plug is disposed into the antifuse aperture prior to the formation of the antifuse material layers. Referring now to FIG. 3, an antifuse 32 having a lower electrode 34 with a lower barrier layer 36 disposed on its surface is defined from a first metal layer formed on the surface of a substrate 38. An inter-metal dielectric layer 40 is disposed over the surface of the substrate 38 and the lower barrier layer 36. An aperture 42 is formed in the inter-metal dielectric 40 such that the upper surface of the lower barrier layer 36 is exposed. In contrast to the embodiment shown in FIG. 1, a metal plug material 44, preferably W, is then formed in the antifuse aperture 42.

The remaining structure in this embodiment is formed as the embodiment shown in FIG. 1. A first antifuse material layer 46 is next formed over the metal plug material 44. A highly conductive material layer 48 is formed over the first antifuse material layer 46, a second antifuse material layer 50 is formed over the highly conductive material layer 48, and an upper barrier layer 52 is interposed between an upper metal electrode 54 formed over the second antifuse dielectric layer 50 and defined from a second metal layer. The first antifuse material layer 46, the highly conductive material layer 48, the second antifuse material layer 50, the upper barrier layer 52 and the upper antifuse electrode 54 are then masked and etched in a single step to form the structure shown in FIG. 3.

Those of ordinary skill in the art will recognize that the programming voltage at which the antifuse will program will be the approximately the same as for the antifuse shown in FIG. 1, given similar layer thicknesses. The same two-step programming process may be advantageously employed to program the antifuse of FIG. 3.

As in the embodiment described in FIG. 1, this embodiment of the antifuse according to the present invention also possesses the superior characteristics indicated in the discussion of FIG. 1. The highly conductive layer results in a link which is larger, more conductive and more stable, and the electromigration and stress migration resistance of the antifuse structure of the present invention are significantly improved.

Referring now to FIGS. 4a–4e, the structure of an antifuse according to the embodiment of the present invention set forth in FIG. 1 is shown after performance of selected steps in the fabrication process.

Figure 4A:
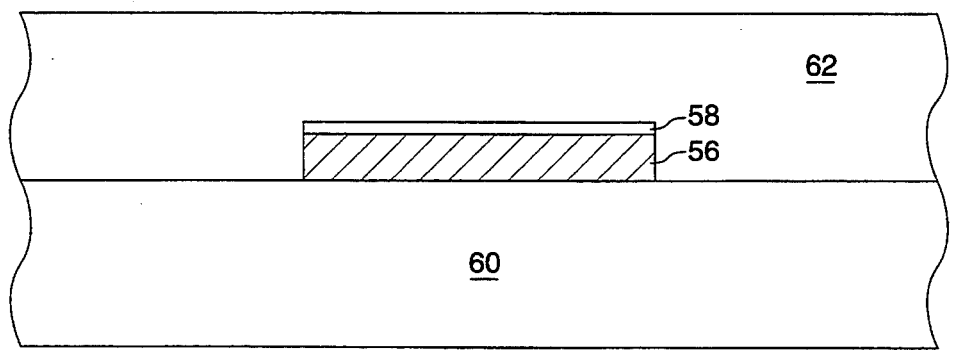
FIG. 4a–4e are cross sectional views of the antifuse structure of FIG. 1 shown at selected points during the fabrication process.

In FIG. 4a, a lower electrode 56 comprising a portion of a first metal interconnect layer and including a lower barrier layer 58 is formed on a substrate 60 using well-known conventional processing techniques. A thin inter-metal dielectric layer 62 is formed over the substrate 60 and the lower barrier layer 58. Inter-metal dielectric layer 62 may comprise a number of materials. CVD oxide, formed using well known techniques, is commonly employed. FIG. 4a shows the structure resulting after formation of the inter-metal dielectric layer 62.

Figure 4B:
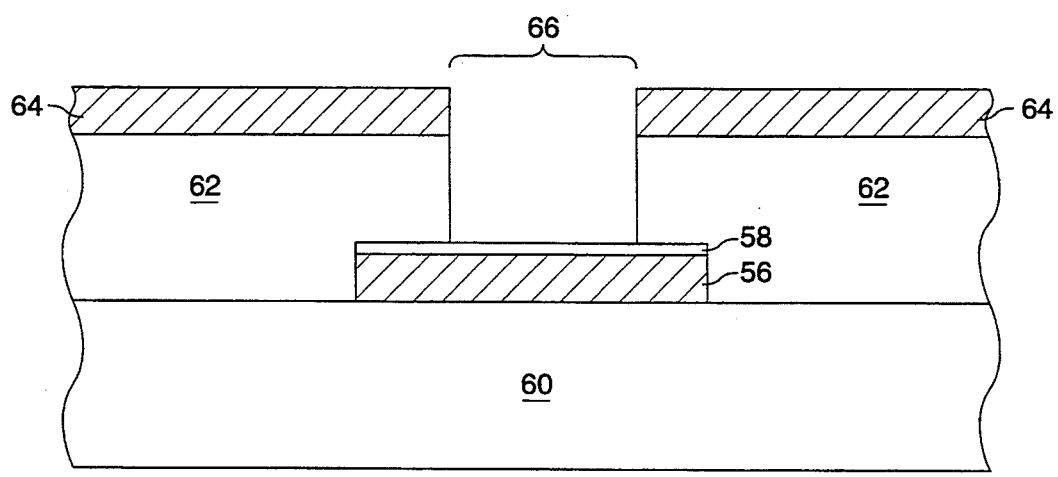

Referring now to FIG. 4b, a masking layer 64, which usually comprises a photoresist layer, is placed over the surface of the inter-metal dielectric layer 62. Masking layer 64 is used to form an antifuse aperture 66 by a single etching step, and thereby exposing lower barrier layer 58. FIG. 4b shows the formation of the antifuse aperture 66 following the etch step but prior to the removal of the masking layer 64. Methods for forming the masking layer and performing the single etching step required are well known in the prior art. For a typical present day antifuse, this aperture may have a size of approximately 0.8 microns, although those of ordinary skill in the art will recognize that other sizes may be employed and that progress in processing technology will allow smaller features to be produced in the future.

Figure 4C:
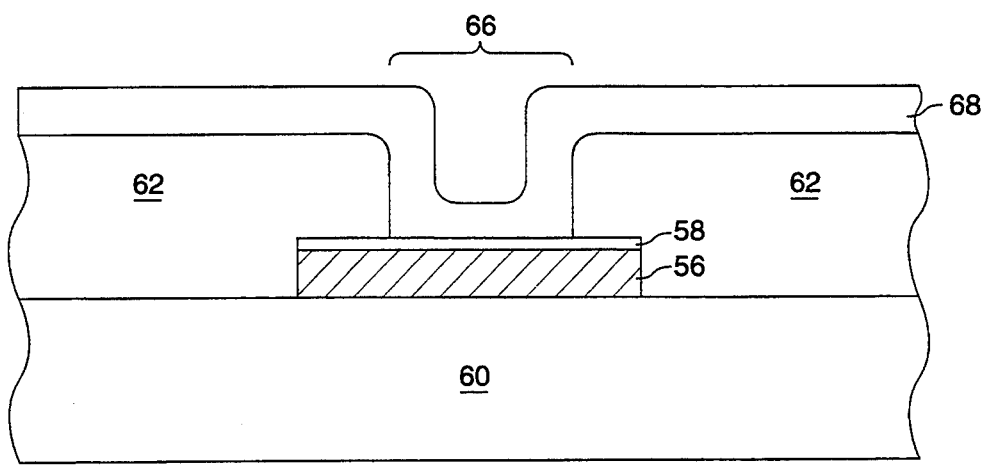

Referring now to FIG. 4c, the differences between the prior art antifuses and the antifuse of the present invention will begin to be seen.

As with any conventional antifuse the masking layer 64 will now be removed in preparation for the formation of an antifuse material layer in the antifuse aperture 66. In a conventional antifuse fabrication process, a thick layer of antifuse material would be disposed over the lower barrier layer 58. Typically, this layer is 50 nm to 800 nm thick. According to the present invention, however a thin first antifuse material layer 68 is disposed over the lower barrier layer 58 using well known techniques to partially fill the antifuse aperture 66. The first antifuse material layer 68 may comprise one of a number of different materials, such as $SiO_2$ or $Si_3N_4$ having a thickness in the range of about 5 nm to 20 nm or a layer of amorphous silicon having a thickness of between about 10 nm to 150 nm or a combination thereof.

Figure 4D:
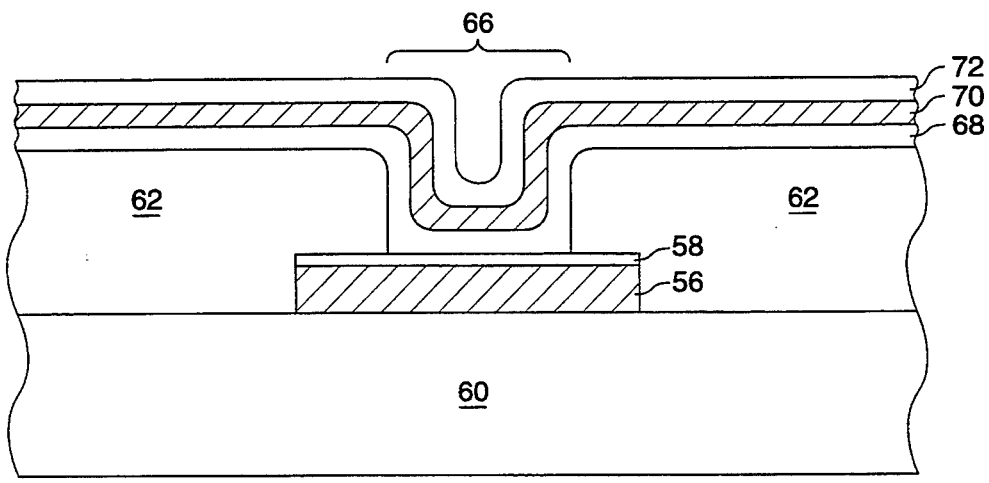

Referring now to FIG. 4d, a highly conductive layer 70 is formed over the top of the first antifuse material layer 68 in the antifuse aperture 68 utilizing well known techniques in the art. Those ordinarily skilled in the art will recognize that since the highly conductive layer 70 will float in the between the antifuse dielectric layers, choosing materials with higher electromigration resistance will improve the overall electromigration resistance of the antifuse device. These materials include a layer of Ti, TiN, TiW or a combination thereof or Cu or AlCu or other similar materials in combination with Ti, TiN, TiW or a combination thereof having a total thickness of between about 10 nm and 500 nm. Other highly conductive materials, such as doped polysilicon or doped amorphous silicon, may also be employed having a thickness ranging from about 10 nm and 500 nm. A second antifuse material layer 72 is formed over the top of the highly conductive layer 70 in the antifuse aperture 66 utilizing well known techniques in the art.

Figure 4E:
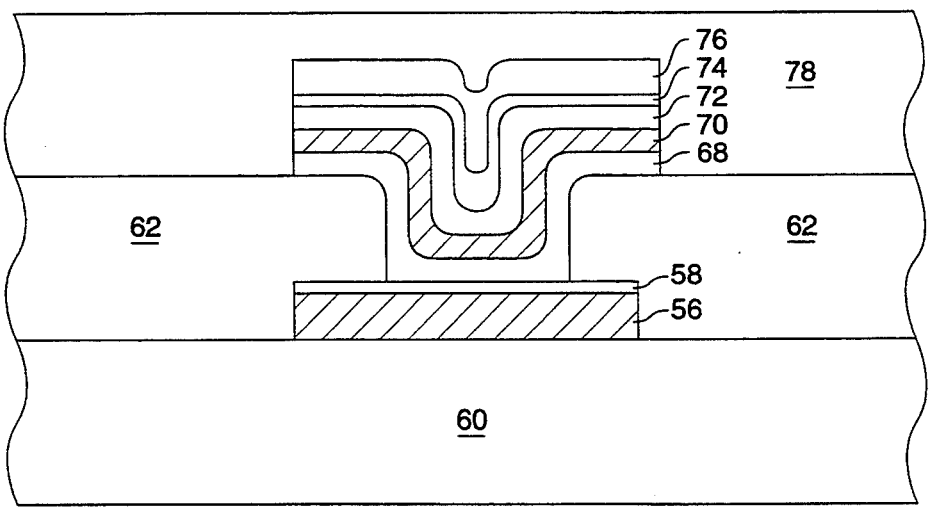

In FIG. 4e, an upper barrier layer 74 and upper conducting layer 76 have been formed over the second antifuse material layer 72. The final assembly of the antifuse is shown after the first antifuse material layer 68, the highly conductive layer 70, the second antifuse material layer 72, the upper barrier layer 74 and upper conducting layer 76 are masked and etched as is well known in the art and a passivation layer 78 is disposed by means known in the art, whereby the structure according to the present invention possesses a sandwiched highly conductive layer.

Figure 5A:
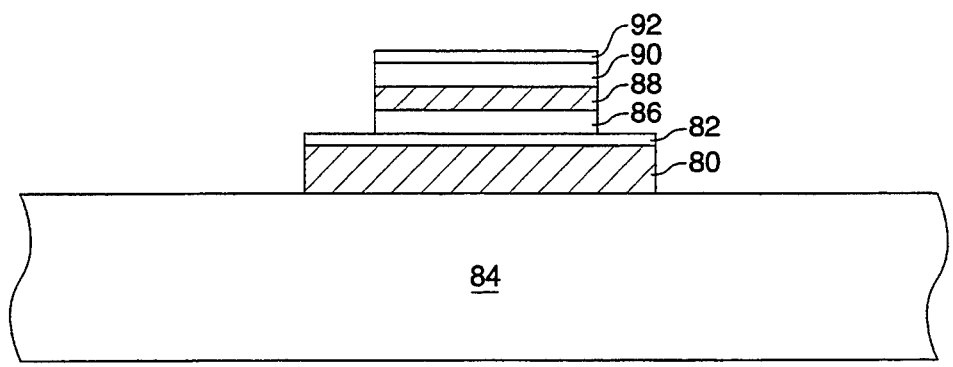
FIG. 5a–5c are cross sectional views of an antifuse structure of FIG. 2 shown at selected points during the fabrication process.
Figure 5B:
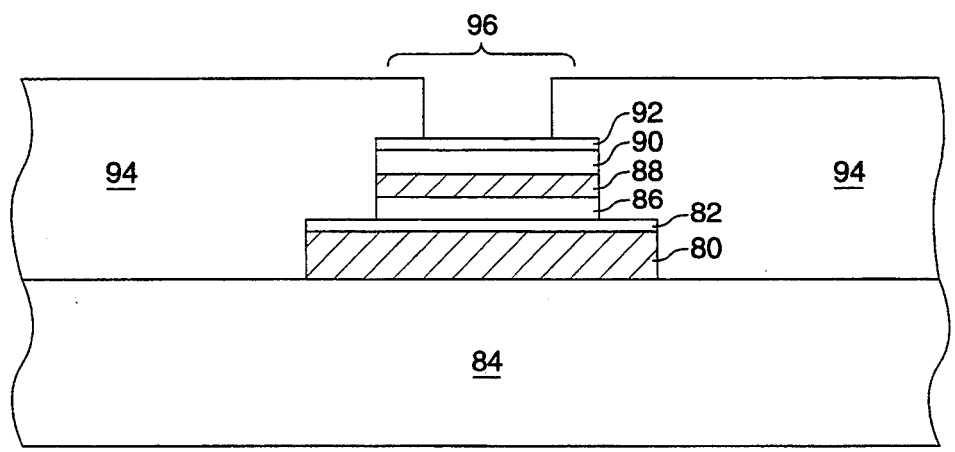
Figure 5C:
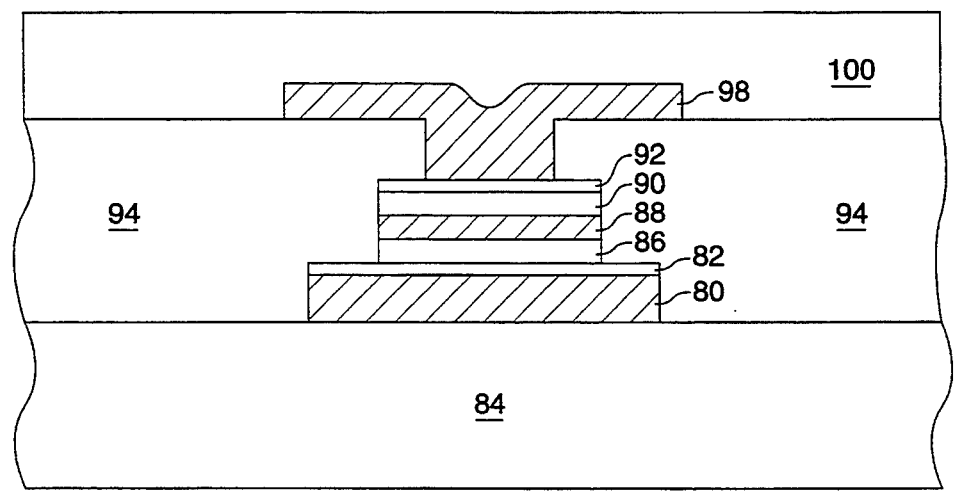

Referring now to FIGS. 5a–5c, the structure of an antifuse according to the embodiment of the present invention set forth in FIG. 2 is shown after performance of selected steps in the fabrication process.

In FIG. 5a, a lower electrode 80 having a lower barrier layer 82 formed thereon is defined from a first metal layer and is formed on a substrate 84. Disposed over the barrier layer 82 and the substrate 84 is a thin first antifuse material layer 86. The first antifuse material layer 86 may comprise one of a number of different materials, such as amorphous silicon, $SiO_2$ or $Si_3N_4$. The thin first antifuse material layer 86 has a thickness of approximately 10 nm to 150 nm for amorphous silicon and a thickness of approximately 5 nm to 20 nm for $SiO_2$ or $Si_3N_4$. This is in contrast to the thicker antifuse layers used in conventional antifuses which typically have a thickness of approximately 50 nm to 800 nm.

A highly conductive layer 88 is formed over the top of the first antifuse material layer 86. The highly conductive layer 88 may preferably comprise a layer of Ti, TiN, TiW or a combination thereof or Cu or AlCu or other similar materials in combination with Ti, TiN, TiW or a combination thereof having a total thickness of between about 10 nm and 500 nm. Other highly conductive materials, such as doped polysilicon or doped amorphous silicon, may also be employed having a thickness ranging from about 10 nm and 500 nm. Again as pointed out in the embodiment of FIG. 1, those ordinarily skilled in the art will recognize that since the highly conductive layer 88 will float in the between the antifuse dielectric layers, choosing materials with higher electromigration resistance will improve the overall electromigration resistance of the antifuse device.

Next, a second antifuse material layer 90 is formed over the top of the highly conductive layer 88. An upper barrier layer 92 is then be formed over the second antifuse material layer 90. The necessity of whether to form the upper barrier layer 92 depends upon the materials employed in the second antifuse material layer 90 and an upper electrode. The first antifuse material layer 86, the highly conductive layer 88, the second antifuse material layer 90, and the upper barrier layer 92 are then masked and etched as is well known in the art to form the antifuse stack shown in FIG. 5a.

Referring now to FIG. 5b, a thin inter-metal dielectric layer 94 is formed over the top of the antifuse stack shown in FIG. 5a. Inter-metal dielectric layer 94 may comprise a number of materials. For example,CVD oxide, formed using well known techniques, is commonly employed. The inter-metal dielectric layer 94 is then masked and etched using well known techniques to form the aperture 96. This aperture 96 is formed such that the upper surface of the antifuse stack is exposed. For a typical present day antifuse, this aperture may have a size of approximately 0.8 microns, although those of ordinary skill in the art will recognize that other sizes may be employed and that progress in processing technology will allow smaller features to be produced in the future.

Finally, as shown in FIG. 5c a second metal layer is formed over the surface of inter-metal dielectric layer 94 and within antifuse aperture 96, and then defined to form an upper antifuse electrode 98. A passivation layer 100 is then formed over the entire antifuse structure. Convention processing techniques are employed to form both the upper antifuse electrode 98 and the passivation layer 100.

Referring now to FIGS. 6a-6e, the structure of an antifuse according to the embodiment of the present invention set forth in FIG. 3 is shown after performance of selected steps in the fabrication process.

Figure 6A:
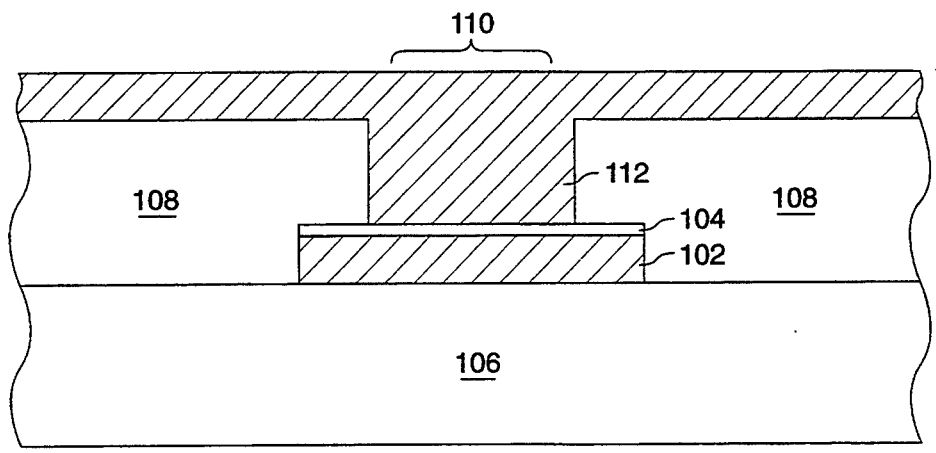
FIG. 6a–6c are cross sectional views of an antifuse structure of FIG. 3 shown at selected points during the fabrication process.

In FIG. 6a, a lower electrode 102 comprising a portion of a first metal interconnect layer and including a lower barrier layer 104 is formed on a substrate 106 using well-known conventional processing techniques. A thin inter-metal dielectric layer 108 with an ant/fuse aperture 110 formed therein is formed over the substrate 106 and the lower barrier layer 104. Inter-metal dielectric layer 108 may comprise a number of materials. CVD oxide, formed using well known techniques, is commonly employed. For a typical present day ant/fuse, aperture 110 may have a size of approximately 0.8 microns, although those of ordinary skill in the art will recognize that other sizes may be employed and that progress in processing technology will allow smaller features to be produced in the future.

Referring to FIG. 6a, a blanket deposition of a metal plug material 112, preferably W, is shown formed over the surface of the inter-metal dielectric layer 108 and within the ant/fuse aperture 110. Deposition techniques useful for fabricating the structures of the present invention are known to those of ordinary skill in the art. A discussion of illustrative known blanket and selective deposition techniques suitable for the plug processes described herein is found in Wolf and Tamber, *Silicon Processing for the VLSI Era*, Vol. 1, pp. 400–403.

Figure 6B:
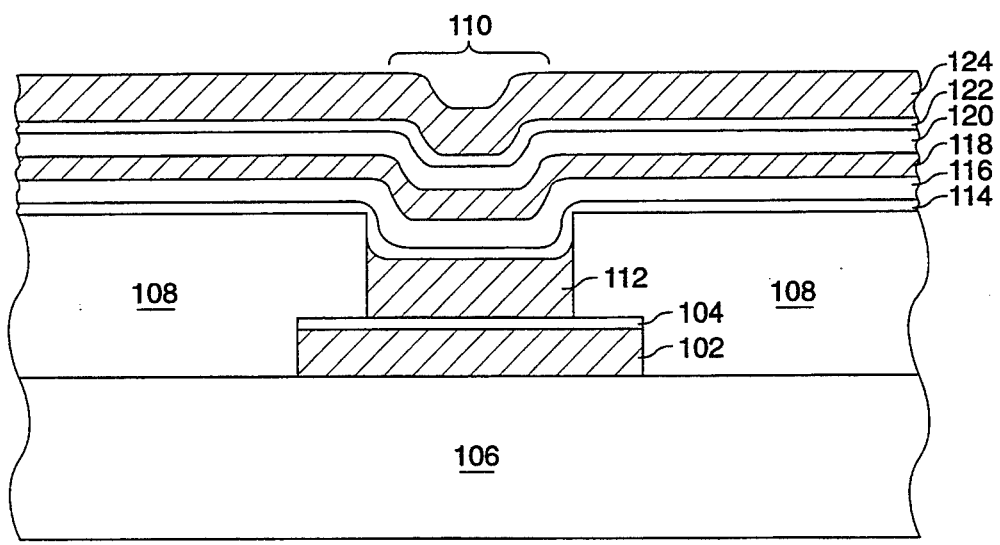

Referring now to FIG. 6b, a metal etchback of the blanket deposition of tungsten has been performed using conventional processing techniques to form the metal plug material 112 in ant/fuse aperture 110. Next, a lower barrier layer 114 and a thin first ant/fuse material layer 116 disposed over the lower barrier layer 114 are formed on the surface of the inter-metal dielectric layer 108 and the metal plug material 112 in ant/fuse aperture 110 using well known techniques. The first ant/fuse material layer 116 may comprise one of a number of different materials, such as $SiO_2$ or $Si_3N_4$ having a thickness in the range of about 5 nm to 20 nm or a layer of amorphous silicon having a thickness of between about 10 nm to 150 nm or a combination thereof.

Next, a highly conductive layer 118 is formed over the top of the first antifuse material layer 116 in the antifuse aperture 110 utilizing well known techniques in the art. Those ordinarily skilled in the art will recognize that since the highly conductive layer 118 will float in the between the antifuse dielectric layers, choosing materials with higher electromigration resistance will improve the overall electromigration resistance of the antifuse device. The highly conductive layer 118 employs the same materials indicated for use in the highly conductive layer in the embodiment shown in FIG. 1. A second antifuse material layer 120 with an intervening upper barrier layer 122 is formed over the top of the highly conductive layer 118 utilizing well known techniques in the art. Finally, an upper conducting layer 124 is formed over the upper barrier layer 122.

Figure 6C:
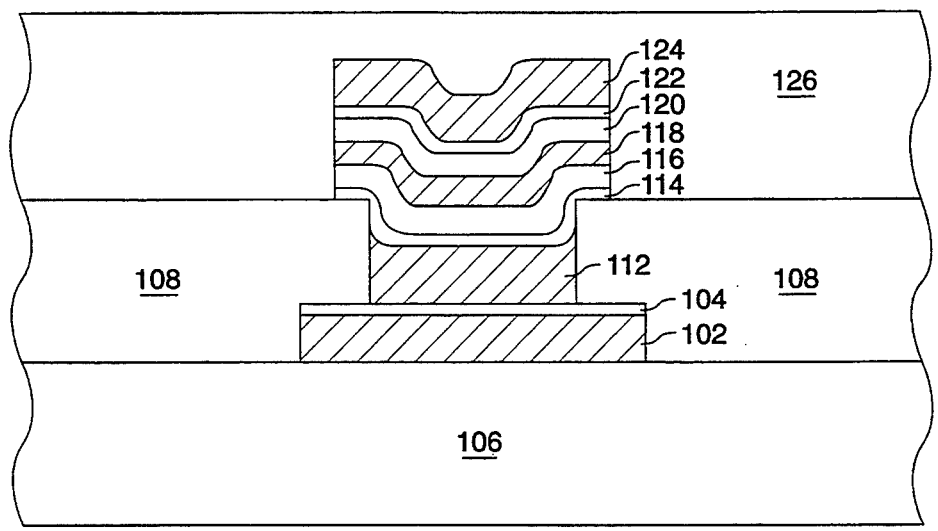

In FIG. 6c, the final assembly of the antifuse is shown after the lower barrier layer 114, the first antifuse material layer 116, the highly conductive layer 118, the second antifuse material layer 120, the upper barrier layer 122 and upper conducting layer 124 are masked and etched as is well known in the art, and a passivation layer 126 is formed by means known in the art, whereby the structure according to the present invention possesses a sandwiched highly conductive layer.

Those ordinarily skilled in the art will recognize that both barrier material and antifuse material of single or multi-layers may be utilized in order to achieve the optimum results. The present invention may be practiced using any combination of conductive materials for the upper and lower electrode. Techniques for the formation of such layers are well within the level of ordinary skill in the art. Those of ordinary skill in the art will recognize that where the layers recited herein for the upper and lower electrodes are to be formed from materials, such as metals or barrier materials, which are normally utilized in semiconductor structures, these layers may have the thickness commonly employed for such layers in normal use in semiconductor structures.

The present invention includes embodiments wherein the lower electrode is formed in a layer above and insulated from the surface of the semiconductor substrate. Such layers include polysilicon layers and metal layers, and known variations of such layers, such as where barrier metal layers are employed.

Those of ordinary skill in the art will appreciate that embodiments are possible according to the present invention having an antifuse sandwhich employing more than one highly conductively layer having antifuse material layers interposed between the highly conductive layers.

While embodiments and applications of this invention have been shown and described, it would be apparent to those of ordinary skill in the art that many more modifications than mentioned above are possible without departing from the inventive concepts herein. The invention, therefore, is not to be restricted except in the spirit of the appended claims.

What is claimed is:

1. An electrically programmable antifuse comprising:
    a lower electrode;
    an inter-metal dielectric layer disposed over said lower electrode, said inter-metal dielectric layer including an antifuse cell opening formed therein;
    a first layer of antifuse material, said antifuse material disposed in said antifuse cell opening;
    a highly electrically conductive layer, formed from a metal, said highly electrically conductive layer disposed over said first layer of antifuse material in said antifuse cell opening; and
    a second layer of antifuse material, said second layer of antifuse material disposed over said highly electrically conductive layer in said antifuse cell opening.

2. An electrically programmable antifuse structure comprising:
    a first electrode;
    an insulating layer disposed over said first electrode;
    a cell opening completely penetrating said insulating layer and exposing said first electrode;
    a first layer of an antifuse material disposed in said cell opening;
    a layer of a highly electrically conductive material, formed from a metal, disposed over said first layer of an antifuse material within said cell opening; and
    a second layer of an antifuse material disposed in said cell opening.

3. An electrically programmable antifuse structure according to claim 2 further comprising a second electrode disposed over and in contact with said second layer of an antifuse material.

4. An electrically programmable antifuse structure according to claim 3 wherein said layer of a highly electrically conductive material is a material selected from the group consisting of: TiN, Ti, TiW, W, Cu, AlCu.

5. An electrically programmable antifuse structure according to claim 3 wherein said second electrode comprises a layer of aluminum disposed over a layer fabricated of a diffusion barrier material.

* * * * *

UNITED STATES PATENT AND TRADEMARK OFFICE
CERTIFICATE OF CORRECTION

PATENT NO. : 5,449,947
DATED : September 12, 1995
INVENTOR(S) : Wenn-Jei Chen, Steve S. Chiang, Esam Elashmawi It is certified that error appears in the above-indentified patent and that said Letters Patent is hereby corrected as shown below:

Column 6, line 3, replace "are" with --is--.

Column 8, line 9, replace the second occurrence of "12" with --14--.

Column 8, line 10, replace "12" with --14--.

Column 10, line 19, replace the second occurrence of "68" with --66--.

Column 11, line 55, replace "ant/fuse" with --antifuse--.

Column 11, lines 60-61, replace "ant/fuse" with --antifuse--.

Column 12, line 1, replace "ant/fuse" with --antifuse--.

Column 12, line 11, replace "ant/fuse" with --antifuse--.

Column 12, line 12, replace "ant/fuse" with --antifuse--.

Column 12, line 15, replace "ant/fuse" with --antifuse--.

Column 12, line 16, replace "ant/fuse" with --antifuse--.

Signed and Sealed this

Fourth Day of June, 1996

*Attest:*

BRUCE LEHMAN

*Attesting Officer*  *Commissioner of Patents and Trademarks*